(12) United States Patent
Vaucher

(10) Patent No.: US 8,437,816 B2
(45) Date of Patent: *May 7, 2013

(54) SUPERCONDUCTING OSCILLATOR

(75) Inventor: Alexander R. Vaucher, Chino Hills, CA (US)

(73) Assignee: Vaucher Aerospace Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/171,062

(22) Filed: Jun. 28, 2011

(65) Prior Publication Data
US 2012/0010083 A1    Jan. 12, 2012

Related U.S. Application Data

(60) Provisional application No. 61/361,849, filed on Jul. 6, 2010.

(51) Int. Cl.
*F16C 39/06*    (2006.01)
(52) U.S. Cl.
USPC .......................................................... 505/166
(58) Field of Classification Search .................. 505/166, 505/211
See application file for complete search history.

(56) References Cited

U.S. PATENT DOCUMENTS

| | | | |
|---|---|---|---|
| 2,725,474 A | 11/1955 | Ericsson et al. | |
| 3,188,579 A | 6/1965 | Meiklejohn | |
| 3,363,200 A | 1/1968 | Jaklevic et al. | |
| 4,901,038 A | 2/1990 | Dusclaux et al. | |
| 5,015,622 A | 5/1991 | Ward et al. | |
| 5,122,506 A | 6/1992 | Wang | |
| 5,126,317 A | 6/1992 | Agarwala | |
| 5,410,199 A | 4/1995 | Kinugasa et al. | |
| 5,559,384 A | 9/1996 | Boland et al. | |
| 5,805,036 A | 9/1998 | Hodge et al. | |
| 5,831,362 A | 11/1998 | Chu et al. | |
| 6,175,175 B1 | 1/2001 | Hull | |
| 6,231,011 B1 | 5/2001 | Chu et al. | |
| 6,762,522 B2 | 7/2004 | Steinmeyer | |
| 6,861,770 B2 | 3/2005 | Travers | |
| 6,876,877 B2 | 4/2005 | Eden | |
| 6,894,406 B2 | 5/2005 | Kinder | |
| 7,098,559 B2 | 8/2006 | Travers | |

*Primary Examiner* — Colleen Dunn
(74) *Attorney, Agent, or Firm* — Knobbe, Martens, Olson & Bear LLP

(57) ABSTRACT

An oscillator and method for applying a time-varying force to a magnet is provided. The oscillator includes a superconductor material at a temperature. The superconductor material is in a superconducting state in the presence of an external magnetic field below a critical field strength, wherein the critical field strength is a function of the temperature of the superconductor material. The oscillator further includes at least one magnetic field source configured to apply a magnetic field having a time-varying field strength to the superconductor material. The time-varying field strength cycles between at least a first field strength below the critical field strength for the superconductor material at the temperature and at least a second field strength above the critical field strength for the superconductor material at the temperature, such that the superconductor material cycles between a superconducting state and a non-superconducting state.

19 Claims, 5 Drawing Sheets

SUPERCONDUCTING OSCILLATOR

CROSS-REFERENCE TO RELATED APPLICATIONS

The present application claims the benefit of priority to U.S. Provisional Appl. No. 61/361,849, filed Jul. 6, 2010, which is incorporated in its entirety by reference herein. The present application is related to the following U.S. patent applications, filed on even date herewith, and incorporated in their entireties by reference herein: U.S. patent application Ser. No. 13/171,071; U.S. patent application Ser. No. 13/171,060; U.S. patent application Ser. No. 13/171,074; U.S. patent application Ser. No. 13/171,016; and U.S. patent application Ser. No. 13/171,052.

BACKGROUND

1. Field of the Invention

The present invention relates generally to oscillators, sensors, generators, and motors utilizing superconductivity.

2. Description of the Related Art

The phenomenon of superconductivity was discovered in 1911 in the Netherlands by Kamerlingh Onnes and collaborators (see, H. K. Onnes, Commun. Phys. Lab. University of Leiden, Suppl., 34b (1913)). Since that time, it has been exploited for many applications.

The phenomenon of superconductivity is one of the most amazing physical phenomena discovered thus far. It falls under a larger category of physical phenomenon known collectivity as "critical phenomenon," "phase transitions," or "correlated systems." Substances that exhibit these phenomena undergo a transformation that affects their physical properties on a macroscopic scale in a dramatic and observable way. This radical change in behavior usually occurs at a particular temperature called the "critical temperature." The onset of the transitions are predictable and are accompanied by a highly correlated behavior below the critical temperature, for the electrons in the substance, as in the case of superconductors, or for the particles making up the substance as in the case of superfluids. For a general discussion of critical phenomenon, see Tinkham, M. *Introduction to Superconductivity*, $2^{nd}$ ed., McGraw-Hill, (1996). The phenomenon of superconductivity is discussed herein and a certain property of its behavior is identified for its useful potential applications in certain embodiments described herein (e.g., for oscillators, sensors, generators, and motors).

As mentioned above, superconductivity is one of the many manifestations of critical phenomenon known in physics. Superconductivity is characterized by the complete absence of electrical resistance in a substance below the critical temperature. Not all materials exhibit superconductivity. Known superconductors include some metals or alloys of metals, which become superconducting at temperatures around 4 to 30 degrees Kelvin. More recently, certain ceramic materials have been discovered that exhibit superconductivity at a relatively high temperature around 93 degrees Kelvin (see, Bendorz, J. G., Müller, K. A., Z. Phys. B64, 189 (1986)). This is particularly useful as it can be conveniently attained using liquid nitrogen which is at 77 degrees Kelvin. This class of "high temperature superconductors" (HTS) has opened up a whole new avenue of possibilities of superconductivity; however, this technology remains largely undeveloped.

SUMMARY

In certain embodiments, an oscillator for applying a time-varying force to a magnet is provided. The oscillator comprises a high-temperature superconductor material at a temperature. The superconductor material is in a superconducting state in the presence of an external magnetic field below a critical field strength, wherein the critical field strength is a function of the temperature of the superconductor material. The oscillator further comprises a magnet configured to move relative to the material and to have a magnetic field that interacts with the superconductor material. The oscillator further comprises a first superconducting coil configured to apply a non-zero time-invariant magnetic field strength to the superconductor material. The oscillator further comprises a second superconducting coil configured to apply a time-varying magnetic field strength to the superconductor material. A sum of the non-zero time-invariant magnetic field strength and the time-varying magnetic field strength cycles between at least a first field strength below the critical field strength for the superconductor material at the temperature and at least a second field strength above the critical field strength for the superconductor material at the temperature, such that the superconductor material cycles between a superconducting state and a non-superconducting state. A time-varying force is applied to the magnet by an interaction of the magnet's magnetic field with the superconductor material.

In certain embodiments, an oscillator is provided, the oscillator comprising a superconductor material at a temperature. The superconductor material is in a superconducting state in the presence of an external magnetic field below a critical field strength, wherein the critical field strength is a function of the temperature of the superconductor material. The oscillator further comprises at least one magnetic field source configured to apply a magnetic field having a time-varying field strength to the superconductor material. The time-varying field strength cycles between at least a first field strength below the critical field strength for the superconductor material at the temperature and at least a second field strength above the critical field strength for the superconductor material at the temperature, such that the superconductor material cycles between a superconducting state and a non-superconducting state.

In certain embodiments, a method of applying a time-varying force to a magnet is provided. The method comprises providing a superconductor material at a temperature. The superconductor material is in a superconducting state in the presence of an external magnetic field below a critical field strength, wherein the critical field strength is a function of the temperature of the superconductor material. The method further comprises providing a magnet having a first magnetic field that interacts with the superconductor material. The method further comprises applying a second magnetic field having a time-varying field strength to the superconductor material. The time-varying field strength cycles between at least a first field strength below the critical field strength for the superconductor material at the temperature and at least a second field strength above the critical field strength for the superconductor material at the temperature, such that the superconductor material cycles between a superconducting state and a non-superconducting state, wherein a time-varying force is applied to the magnet by an interaction of the first magnetic field with the superconductor material.

DETAILED DESCRIPTION

In certain embodiments described herein, a new oscillator based on the phenomenon of superconductivity is realized and identified for its many potential applications (e.g., oscillators, sensors, generators, and motors). This oscillator is based on the Meissner Effect of superconductivity, and is used to create a "Superconducting Oscillator" that can be used to apply a time-varying force to a magnet, which has many potential applications among which are motors of all types, and various sensors. Certain embodiments described herein exploit one property which has many potential applications (e.g., in oscillators, sensors, generators, and motors).

Figure 1A:
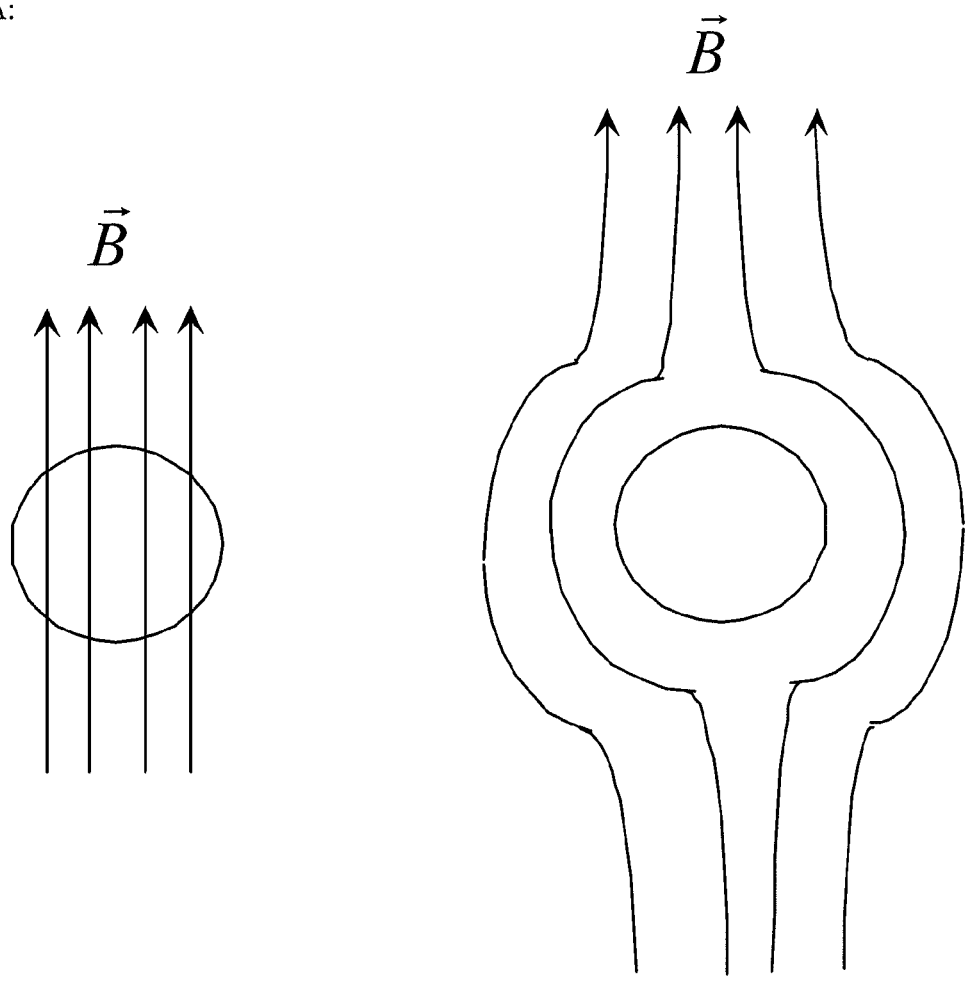
FIG. 1A schematically illustrates a superconductor material at a temperature greater than the critical temperature immersed in an external magnetic field then cooled below its critical temperature.
Figure 1B:
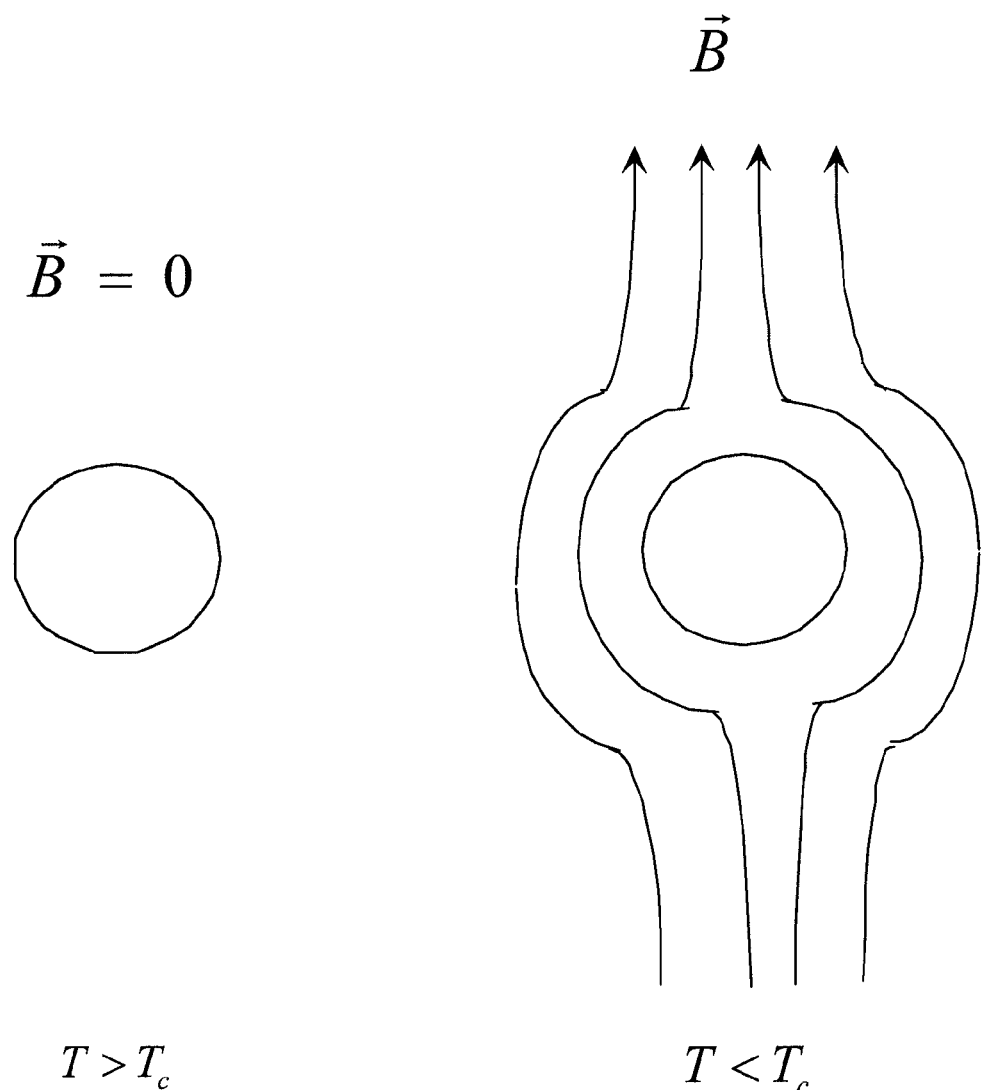
FIG. 1B schematically illustrates a superconductor material at a temperature greater than the critical temperature in zero external magnetic field then cooled below its critical temperature.
Figure 2:
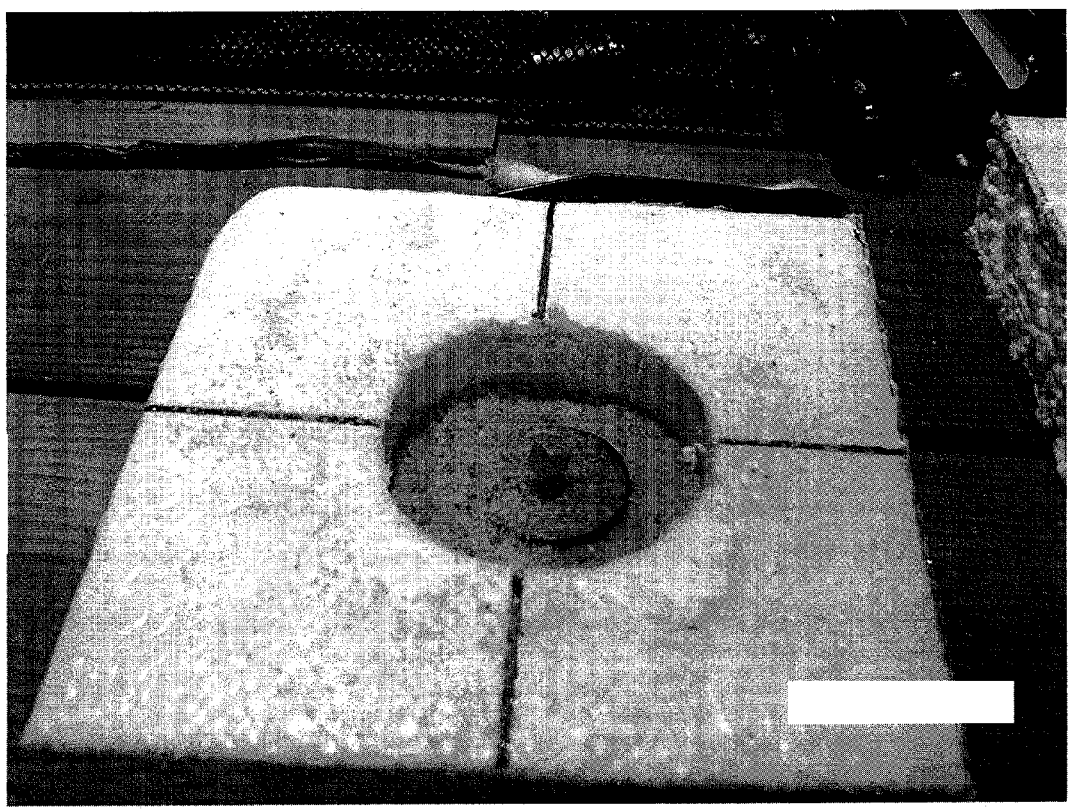
FIG. 2 is a photograph of a small permanent magnet floating above a superconductor material that is below its critical temperature.

The absence of electrical resistance is only one of the properties exhibited by superconductors below the critical temperature. Another very striking effect is the Meissner Effect, named after W. Meissner (see, W. Meissner, R. Ochsenfeld, Naturwiss, 21: 787 (1933)). It was observed that when a superconducting material is cooled in the presence of a magnetic field, when the temperature dropped below the critical temperature, the magnetic field was expelled from the superconductor, as shown schematically in FIG. 1A. This is because the superconductor acts as a perfect diamagnet, expelling the magnetic field. The mechanism by which this occurs is simple; the external magnetic field induces currents in the superconductor. These currents circulate in such a way as to generate a magnetic field that opposes the external field, thus the net field in the superconductor is zero. The same effect also occurs if the magnetic field is introduced after the superconductor is cooled below its critical temperature, as shown in FIG. 1B. This property has the striking effect of causing the superconductor to repel the source of the external magnetic field. FIG. 2 is a photograph showing this phenomenon using a small permanent magnet floating above a superconductor that is below its critical temperature due to the force applied to the magnet by the interaction of its magnetic field with the superconducting material opposing the force of gravity on the magnet. In FIG. 2, the magnet is Neodymium type, the superconductor is ceramic HTS type, YBCO cooled to liquid nitrogen temperature.

Superconductivity in the presence of an external magnetic field follows certain limitations. For a fixed temperature below the critical temperature, as the external magnetic field strength is increased, superconductivity is lost. The value of the magnetic field strength required to destroy the superconducting state generally increases as the operating temperature is lowered below the critical temperature. This phenomenon follows an empirical law (depicted in FIG. 3) in the form of:

$$H_c(T) = H_c(0)\left[1 - \left(\frac{T}{T_c}\right)^2\right] \quad (1)$$

Figure 3:
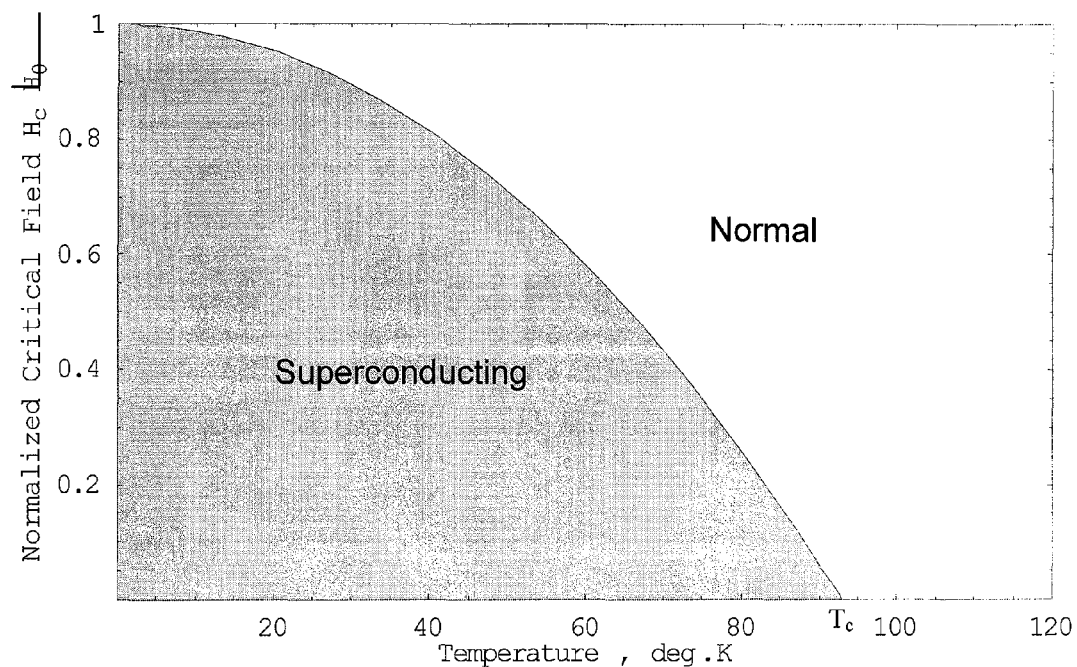
FIG. 3 is a plot of normalized critical field versus temperature for YBCO high temperature superconductor material having a critical temperature at about 93 degrees Kelvin. The region below the curve is the superconducting state, and the region outside the curve is the normal or non-superconducting state.

FIG. 3 is a plot of normalized critical field strength versus temperature for YBCO high temperature superconductor material having a critical temperature at about 93 degrees Kelvin. The region below the curve is the superconducting state, and the region outside the curve is the normal or non-superconducting state. FIG. 3 shows that the superconducting region is confined inside the critical field strength curve. As the temperature changes above and below the critical temperature, the superconductor switches between the normal and superconducting states. This oscillation however is very slow, as the temperature change is slow in nature.

Figure 4:
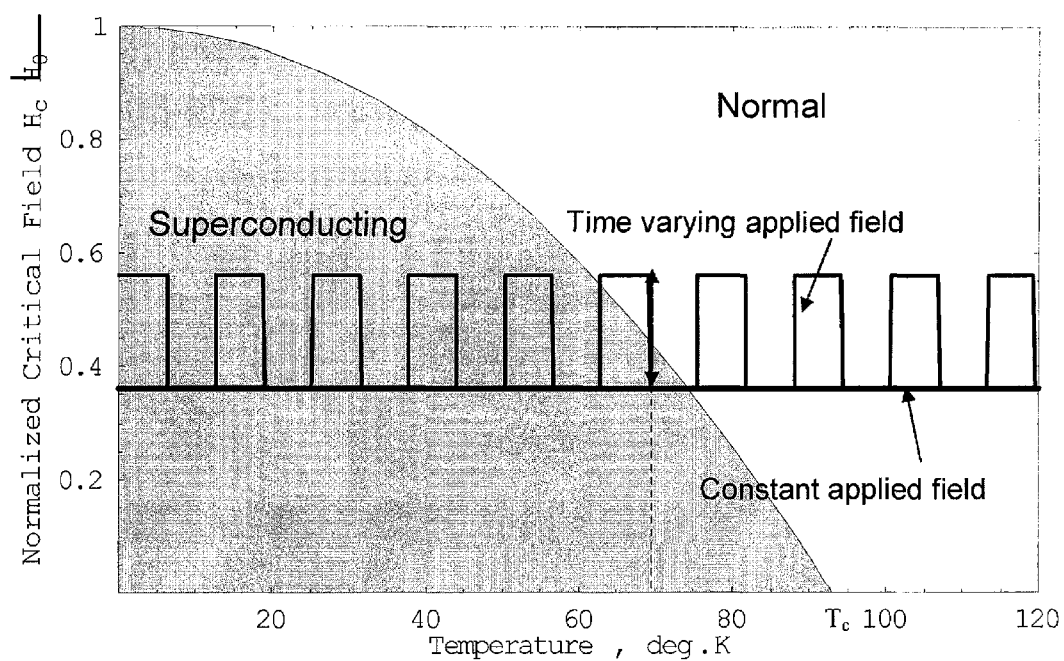
FIG. 4 is the plot of FIG. 3 with a plot of a time-varying external magnetic field applied at a specific temperature superimposed over the applied external time-invariant or constant magnetic field.

The switch between the normal and superconducting states also occurs as the magnetic field strength is switched above or below the critical field strength. In this case, however, the oscillation is instantaneous, because the mechanism responsible is a second order phase transition. In certain embodiments, a convenient temperature can be chosen and a time-varying (e.g., oscillating) component field strength can be applied at the critical field strength value, as schematically illustrated in FIG. 4. Such a configuration will cause the superconductor material to oscillate between the normal and superconducting states at the frequency of the applied field. This in turn will impose a time-varying (e.g., periodic) behavior on the Meissner effect. Thus, a magnet floating above the superconductor will exhibit up and down oscillations at the frequency of the applied field. Since this change of state is virtually instantaneous at a particular fixed temperature, the oscillation of the superconductor will lag the applied field by the relaxation time for the superconductor. This is the time it takes to form the ordered state, in the femtosecond range, which is a very short time. This process is shown schematically in FIG. 4.

FIG. 4 is the plot of FIG. 3 with a plot of a time-varying external magnetic field strength applied to the material at a specific temperature superimposed over the applied external time-invariant or constant magnetic field strength. A time-varying external magnetic field strength (e.g., square wave, with zero minimum) applied at a specific temperature, and superposed over the applied external constant field strength, will force the material into the normal state region, thus destroying superconductivity. During the next half cycle, the total field strength is less than the critical field strength, and superconductivity is restored. The driving frequency is that of the applied field. The limiting frequency is due to the relaxation time for the superconductor, on the order of $10^{-15}$ seconds in certain embodiments. Since the relaxation time of the superconductor material is of the order of $10^{-15}$ seconds, the applied frequency can be very high, e.g., in the terahertz range. Most practical applications will be at much lower frequencies, e.g., in the Hz, kHz, MHz, or GHz ranges. For most mechanical applications, the frequency is likely to be in kHz range. The superconductor material lags the applied field by a phase factor of the order of the relaxation time. In FIG. 4, the driving field of the example oscillator is applied at about 70 degrees Kelvin, which is well below the critical temperature, utilizing DC external field strength of about 0.36 ($H_c/H_0$) where $H_0=H_c(0)$. In certain embodiments, the AC field strength can be applied anywhere on the critical field strength (e.g., at a point of low field strength, but not too close to the critical temperature).

In certain embodiments, the operating temperature is selected to be at or below 93 degrees Kelvin. The operating temperature of certain embodiments is chosen to be sufficiently below the critical temperature since near the critical temperature some instability could take place as the superconductor material transitions between states. As the temperature is chosen increasingly below the critical temperature, the required field strength to change states will increase. Therefore, it becomes a design trade-off issue which will be determined depending on the particular application (e.g., oscillators, sensors, generators, and motors) for a specific requirement. A helpful criterion for determining an appropriate operating temperature below the critical temperature is to know the error margin in the specific temperature control mechanism being used. For example, if a heater with a feedback loop is used that has a response of 0.5 degree Kelvin above or below a chosen operating temperature (set point), then this set point should be at least 0.5 degree Kelvin below the critical temperature. It is a good design practice to select an operating temperature that is two, three, or more times the error margin below the critical temperature (e.g., at least 2 to 5 degrees Kelvin).

The source of the time-invariant or DC field strength in certain embodiments is a superconducting coil (e.g., a primary coil). The source of the time-varying or AC field strength in certain embodiments is a coil with just enough current to move the superconductor material into the normal region and back to the superconducting region (e.g., a secondary coil). Thus, the power used to drive the oscillator is in the smaller applied time-varying field. In certain embodiments, the secondary coil generating the time-varying field strength is a superconducting coil.

The choice of the primary coil and secondary coil currents is a trade-off between the desired performance requirements, and the quality of the superconductor material. The current in the primary coil is selected to be sufficient to bring the applied field from that primary coil to within range of the critical field at the chosen operating temperature. The remaining field used to exceed the critical field is to be applied by the secondary coil. The range of the current flowing through each coil is a particular design parameter. For example, if the critical field at some operating temperature is about 8 Tesla, the field from the primary coil can be set at 7 Tesla. This can be done by charging the primary coil accordingly to deliver 7 Tesla. The remaining 1 Tesla can be applied using the secondary coil. In certain embodiments, the secondary coil is pulsed slightly above the critical field to ensure that the total field exceeds the critical field even accounting for slight temperature fluctuations. When the secondary coil is pulsed on and off in sequence, the Meissner effect takes place sequentially, and the magnet oscillates. The pulsed field is smaller than the primary field in certain embodiments to avoid pulsing a high current, since even superconductors exhibit some AC losses. The question of how to divide the current between the primary and secondary coils also depends on properties of the superconductor. Since the Meissner effect operates in presence of the field of the primary coil, the superconductor critical current will be affected by the presence of this field. In general, critical currents diminish slightly with applied field for all superconductors to varying degrees. For well prepared YBCO, the reduction in critical current is small, and can be compensated for by choosing a smaller field of the primary coil as needed. This in turn will use a larger field from the secondary coil, thus pulsing of slightly higher current.

Certain embodiments described herein can be used in various applications, e.g., reciprocating motors, electromagnetic radiation sensors, magnetic field measurement devices, and antennas operating from sub-millimeter to GHz range.

Various embodiments have been described above. Although this invention has been described with reference to these specific embodiments, the descriptions are intended to be illustrative of the invention and are not intended to be limiting. Various modifications and applications may occur to those skilled in the art without departing from the true spirit and scope of the invention as defined in the appended claims.

What is claimed is:

1. An oscillator for applying a time-varying force to a magnet, the oscillator comprising:

a high-temperature superconductor material at a temperature, wherein the superconductor material is in a superconducting state in the presence of an external magnetic field below a critical field strength, wherein the critical field strength is a function of the temperature of the superconductor material;

a magnet configured to move relative to the material and to have a magnetic field that interacts with the superconductor material;

a first superconducting coil configured to apply a non-zero time-invariant magnetic field strength to the superconductor material; and a second superconducting coil configured to apply a time-varying magnetic field strength to the superconductor material, wherein a sum of the non-zero time-invariant magnetic field strength and the time-varying magnetic field strength cycles between at least a first field strength below the critical field strength for the superconductor material at the temperature and at least a second field strength above the critical field strength for the superconductor material at the temperature, such that the superconductor material cycles between a superconducting state and a non-superconducting state, wherein a time-varying force is applied to the magnet by an interaction of the magnet's magnetic field with the superconductor material.

2. An oscillator comprising:

a superconductor material at a temperature, wherein the superconductor material is in a superconducting state in the presence of an external magnetic field below a critical field strength, wherein the critical field strength is a function of the temperature of the superconductor material; and at least one magnetic field source configured to apply a magnetic field having a time-varying field strength to the superconductor material, wherein the time-varying field strength cycles between at least a first field strength below the critical field strength for the superconductor material at the temperature and at least a second field strength above the critical field strength for the superconductor material at the temperature, such that the superconductor material cycles between a superconducting state and a non-superconducting state.

3. The oscillator of claim 2, wherein the superconductor material comprises YBCO high-temperature superconductor material.

4. The oscillator of claim 2, wherein the superconductor material is in a non-superconducting state without an external magnetic field strength being applied to the superconductor material when the temperature (T) is above a critical temperature ($T_c$), and the critical field strength ($H_c$) is a function of the temperature (T) given by:

$$H_c(T) = H_c(0)\left[1 - \left(\frac{T}{T_c}\right)^2\right],$$

where $H_c(0)$ is a critical field strength of the superconductor material at zero degrees Kelvin.

5. The oscillator of claim 2, wherein the superconductor material is at a temperature at or below liquid nitrogen temperature.

6. The oscillator of claim 2, wherein the superconductor material is at a temperature at or below 93 degrees Kelvin.

7. The oscillator of claim 2, wherein the time-varying field strength comprises a time-invariant portion and a time-varying portion.

8. The oscillator of claim 7, wherein the at least one magnetic field source comprises:
   a first magnetic field source configured to apply the time-invariant portion to the superconductor material; and
   a second magnetic field source configured to apply the time-varying portion to the superconductor material.

9. The oscillator of claim 8, wherein the first magnetic field source comprises a first superconducting wire coil and the second magnetic field source comprises a second superconducting wire coil.

10. The oscillator of claim 7, wherein the time-varying portion has a square wave, and a zero minimum field strength.

11. The oscillator of claim 7, wherein the time-invariant portion has a field strength equal to about 36% of a critical field strength of the superconductor material at zero degrees Kelvin.

12. A method of applying a time-varying force to a magnet, the method comprising:
   providing a superconductor material at a temperature, wherein the superconductor material is in a superconducting state in the presence of an external magnetic field below a critical field strength, wherein the critical field strength is a function of the temperature of the superconductor material;
   providing a magnet having a first magnetic field that interacts with the superconductor material; and
   applying a second magnetic field having a time-varying field strength to the superconductor material, wherein the time-varying field strength cycles between at least a first field strength below the critical field strength for the superconductor material at the temperature and at least a second field strength above the critical field strength for the superconductor material at the temperature, such that the superconductor material cycles between a superconducting state and a non-superconducting state, wherein a time-varying force is applied to the magnet by an interaction of the first magnetic field with the superconductor material.

13. The method of claim 12, wherein the superconductor material comprises YBCO high-temperature superconductor material.

14. The method of claim 12, wherein the superconductor material is in a non-superconducting state without an external magnetic field strength being applied to the superconductor material when the temperature (T) is above a critical temperature ($T_c$), and the critical field strength ($H_c$) is a function of the temperature (T) given by:

$$H_c(T) = H_c(0)\left[1 - \left(\frac{T}{T_c}\right)^2\right],$$

where $H_c(0)$ is a critical field strength of the superconductor material at zero degrees Kelvin.

15. The method of claim 12, wherein the superconductor material is at a temperature at or below liquid nitrogen temperature.

16. The method of claim 12, wherein the time-varying field strength comprises a time-invariant portion and a time-varying portion.

17. The method of claim 16, wherein the time-invariant portion is applied to the material by a first magnetic field source and the time-varying portion is applied to the material by a second magnetic field source.

18. The method of claim 17, wherein the first magnetic field source comprises a first superconducting wire coil and the second magnetic field source comprises a second superconducting wire coil.

19. The method of claim 16, wherein the time-varying portion has a square wave, and a zero minimum field strength.

* * * * *